United States Patent
Wu et al.

(10) Patent No.: US 9,536,888 B2
(45) Date of Patent: Jan. 3, 2017

(54) METHOD TO PREVENT OXIDE DAMAGE AND RESIDUE CONTAMINATION FOR MEMORY DEVICE

(71) Applicant: Taiwan Semiconductor Manufacturing Co., Ltd., Hsin-Chu (TW)

(72) Inventors: Chang-Ming Wu, New Taipei (TW); Harry-Hak-Lay Chuang, Zhubei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 14 days.

(21) Appl. No.: 14/580,505

(22) Filed: Dec. 23, 2014

(65) Prior Publication Data

US 2016/0181261 A1    Jun. 23, 2016

(51) Int. Cl.
| | | |
|---|---|---|
| H01L 31/112 | (2006.01) | |
| H01L 27/108 | (2006.01) | |
| H01L 29/00 | (2006.01) | |
| H01L 31/036 | (2006.01) | |
| H01L 27/115 | (2006.01) | |
| H01L 21/28 | (2006.01) | |

(52) U.S. Cl.
CPC ... *H01L 27/11521* (2013.01); *H01L 21/28273* (2013.01); *H01L 27/11526* (2013.01)

(58) Field of Classification Search
USPC ................ 257/314, 296, E27.084, E21.654, 257/E29.309, E29.325, 295, 257/E43.001–E43.007, E27.005–E27.006, 257/E27.008, E29.167, E29.164, E29.272, 257/E29.323, E21.436, E21.663–E21.665, 257/751, 774, 762, 720, 758, 288, 298, 257/E21.579, 776, E21.586, 773, 374, 257/499–564, 763, 757; 438/762, 639, 438/643, 687, 637, 485, 785, 582, 33, 15, 438/3, 669, 709, 760, 597, 299, 448, 396, 438/253, 200, 656, 642, 638, 640, 627, 438/648, 622
See application file for complete search history.

(56) References Cited

U.S. PATENT DOCUMENTS

| | | | |
|---|---|---|---|
| 6,657,248 B1 * | 12/2003 | Matsuzaki | H01L 27/105 257/306 |
| 7,332,407 B2 * | 2/2008 | Wang | H01L 21/28123 257/510 |
| 2005/0042812 A1 * | 2/2005 | Brazzelli | H01L 21/76229 438/200 |
| 2005/0042819 A1 * | 2/2005 | Hao | H01L 27/10838 438/248 |
| 2006/0035437 A1 * | 2/2006 | Mitsuhira | H01L 21/76229 438/424 |
| 2006/0202275 A1 * | 9/2006 | Ichige | H01L 21/823842 257/365 |

(Continued)

*Primary Examiner* — Tram H Nguyen
(74) *Attorney, Agent, or Firm* — Eschweiler & Associates, LLC (57) ABSTRACT

The present disclosure relates a method of forming an integrated circuit. In some embodiments, the method is performed by patterning a first masking layer over a substrate to have a first plurality of openings at a memory cell region and a second plurality of openings at a boundary region. A first plurality of dielectric bodies are formed within the first plurality of openings and a second plurality of dielectric bodies are formed within the second plurality of openings. A second masking layer is formed over the first masking layer and the first and second plurality of dielectric bodies. The first and second masking layers are removed at the memory cell region, and a first conductive layer is formed to fill recesses between the first plurality of dielectric bodies. A planarization process reduces a height of the first (Continued)

conductive layer and removes the first conductive layer from over the boundary region.

20 Claims, 9 Drawing Sheets

(56) References Cited

U.S. PATENT DOCUMENTS

| | | | | |
|---|---|---|---|---|
| 2006/0220097 A1* | 10/2006 | Ogura | .................... | H01L 27/105 257/315 |
| 2008/0157174 A1* | 7/2008 | Jeon | .................. | H01L 27/11521 257/321 |
| 2009/0053871 A1* | 2/2009 | Ahn | .................. | H01L 27/11573 438/287 |
| 2009/0267136 A1* | 10/2009 | Goda | .................... | H01L 27/105 257/324 |
| 2010/0035390 A1* | 2/2010 | Ding | ............... | H01L 21/823462 438/152 |
| 2012/0181592 A1* | 7/2012 | Wang | ............... | H01L 21/76229 257/314 |
| 2016/0013195 A1* | 1/2016 | Tsao | .................. | H01L 29/42328 257/316 |

* cited by examiner

METHOD TO PREVENT OXIDE DAMAGE AND RESIDUE CONTAMINATION FOR MEMORY DEVICE

BACKGROUND

Flash memory is an electronic non-volatile computer storage medium that can be electrically erased and re-programmed. To store information, flash memory includes an addressable array of memory cells; each of which includes a transistor with a floating gate disposed over a substrate separated therefrom by an insulating dielectric layer. As the size of on-chip components is scaled (i.e., reduced), device "shrinkage" allows engineers to integrate more components and more corresponding functionality onto newer generations of ICs. In recent technology nodes, this has allowed for flash memory to be embedded on an integrated chip with logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7-17B illustrate cross-sectional views of some embodiments showing a method of forming an integrated circuit (IC) having a plurality of dielectric bodies disposed at a boundary region.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different devices, such as a memory cell array and a logic circuit, on a same substrate. The fabrication process of these embedded integrate circuits (ICs) may include a series of planarization processes. For example, memory gate structures of an embedded flash memory IC can be formed by depositing a self-aligned conductive layer, followed by a chemical-mechanical polishing (CMP) process that planarizes a top surface of the conductive layer to form the memory gate structures. In such manufacturing processes, the CMP process may not result in a planar surface as expected. This is because the CMP process removes different materials at different rates, resulting in surface anomalies. For example, regions of an embedded flash memory IC having "support", such as memory cell or logic regions having shallow trench isolations (STIs) extending out from the substrate, will have a thicker conductive layer than regions without sufficient "support", such as a boundary region between the memory cell region and the logic region. The non-uniformity of the conductive layer (i.e., the reduced thickness of the conductive layer at the boundary region relative to other regions) results in surface damage to the substrate at the boundary region during the subsequent processes. The unwanted recesses at the boundary region may also introduce contaminants that harm performance of the IC. Furthermore, in current manufacturing processes, residues may be left at corners of STIs in the logic region or other circuitry regions when forming the memory gate for the memory cell region, which may result shorting problems, performance degradation, and even device failure.

Accordingly, the present disclosure relates to a new integrated circuit (IC) structure, and associated processing methods, that prevents residue contamination and damage at a boundary region. In some embodiments, the IC structure is a memory device comprising a memory cell region and a surrounding boundary region. The memory cell region comprises a plurality of flash memory cells disposed over a semiconductor substrate, separated by a plurality of shallow trench isolations (STIs). The boundary region comprises a plurality of dielectric bodies disposed within the semiconductor substrate. In some embodiments, the STIs have an upper surface that is higher than an upper surface of the semiconductor substrate while the dielectric bodies at the boundary region have upper surfaces that are substantially co-planar with the upper surface of the semiconductor substrate. The plurality of the dielectric bodies disposed at the boundary region provide a sufficient support when planarizing a conductive layer to form memory gates of the memory device and further prevent damage of the semiconductor substrate at the boundary region.

Figure 1:
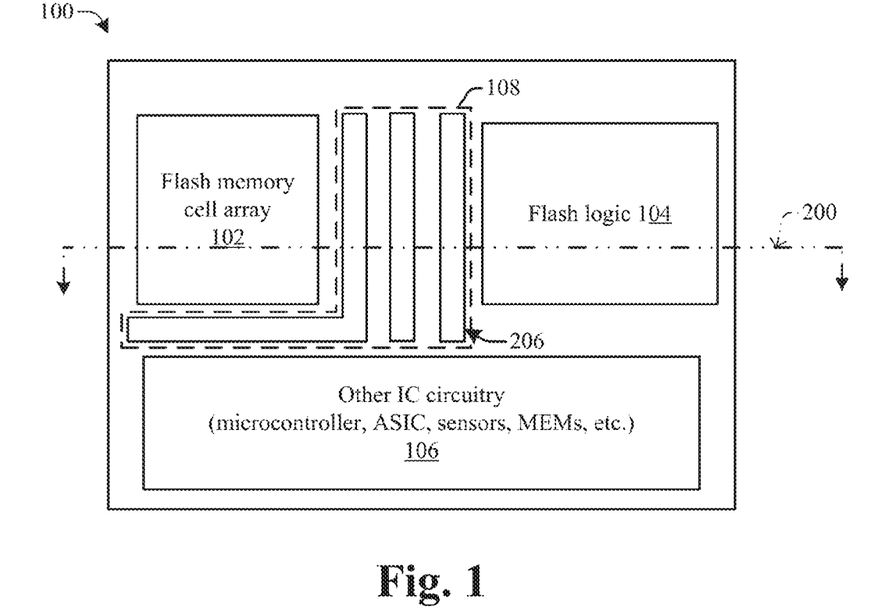
FIG. 1 illustrates a structural view of some embodiments of an integrated circuit (IC) having a plurality of dielectric bodies disposed at a boundary region.

FIG. 1 shows a top view of an integrated circuit (IC) 100 having a plurality of dielectric bodies 206 disposed at a boundary region 108 according to some embodiments. The boundary region 108 surrounds a memory cell region 102. In some embodiments, the IC 100 may further comprise a logic region 104 and/or other IC circuitries 106, such as microcontrollers, application-specific integrated circuits, sensors, micro-electromechanical systems, or other components that are applicable to be integrated.

Figure 2:
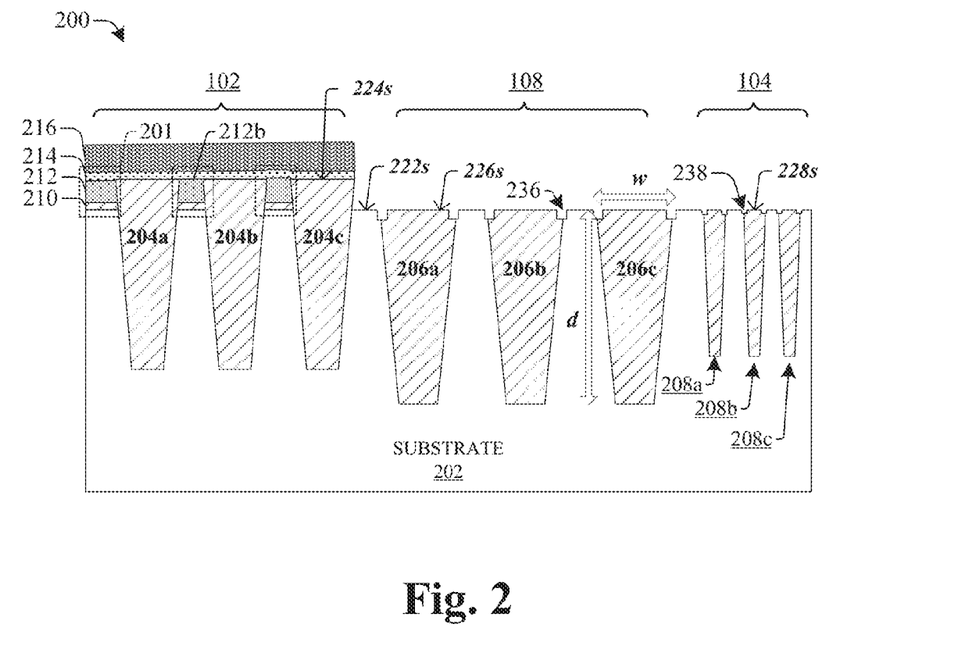
FIG. 2 illustrates a cross-sectional view of some embodiments of an integrated circuit (IC) having a plurality of dielectric bodies disposed at a boundary region.

FIG. 2 shows some embodiments of a cross-sectional view of the integrated circuit (IC) 100 of FIG. 1 taken along cross-sectional line 200.

As shown, the memory cell region 102 comprises a plurality of flash memory cells 201 disposed over a semiconductor substrate 202, and laterally separated by a first plurality of shallow trench isolations (STIs) 204 (such as 204a, 204b, 204c . . . ). The first plurality of STIs 204 have an upper surface 224s that is higher than a planar upper surface 222s of the semiconductor substrate 202. In some embodiments, a plurality of floating gates 212 are respectively disposed between adjacent STIs 204 (e.g. a floating gate 212b is disposed between a first STI 204a and a second STI 204b). A control gate 216 is separated from the floating gate 212 by a charge trapping dielectric 214. A gate dielectric 210 is disposed between the floating gate 212 and the semiconductor substrate 202.

The boundary region 108 comprises a plurality of dielectric bodies 206 (such as 206a, 206b, 206c . . . ), disposed within the semiconductor substrate 202. The plurality of dielectric bodies 206 have upper surfaces 226s that are substantially co-planar with the planar upper surface 222s of the semiconductor substrate 202. In some embodiments, recess rings 236 are respectively disposed at peripherals of the plurality of dielectric bodies 206. The recess rings 236 cause the peripherals of the plurality of dielectric bodies 206 to be recessed below a center of the plurality of dielectric bodies 206. In some embodiments, the plurality of dielectric bodies 206 respectively have a width w that is in a range of from about 200 nm to about 600 nm and a depth d that is in a range of from about 250 nm to about 350 nm. These dimensions can be greater than that of the STIs 204 at the memory cell region 102. For example, for a same chip, the STIs 204 can respectively has a width around 70 nm and a depth around 320 nm.

In some embodiments, the IC 100 further comprises a logic region 104. The logic region 104 is spaced apart from the memory cell region 102 by the boundary region 108. The logic region 104 comprises a second plurality of STIs 208 (such as 208a, 208b, 208c . . . ) disposed within the semiconductor substrate 202. The planar upper surface 222s of the semiconductor substrate 202 is substantially co-planar with upper surfaces 228s of the second plurality of STIs 208. In some embodiments, second recess rings 238 are respectively disposed at peripherals of the second plurality of STIs 208, causing the peripherals of the second plurality of STIs 208 to be recessed below centers of the second plurality of STIs 208. Existence of the second recess rings 238 helps to improve saturation current performance. The second plurality of STIs 208 may respectively have widths and depths that are smaller than that of the plurality of STIs 204 at the memory cell region 102 and the plurality of dielectric bodies 206 at the boundary region 108. For example, for the same example chip given above, the second plurality of STIs 208 can respectively has a width around 40 nm and a depth around 300 nm.

Although the STI regions of FIG. 2 are described as having widths and depths set forth above, it will be appreciated that such width and depth values are non-limiting examples. For example, as the size of an integrated chip scales, the stated width and depth values may also scale accordingly (i.e., the depth and widths given for the STI regions described in relation to FIG. 2 are for 40 nm process node, but may scale for different process nodes, such as 28 nm, 22 nm, 14 nm, 10 nm, etc.).

Figure 3:
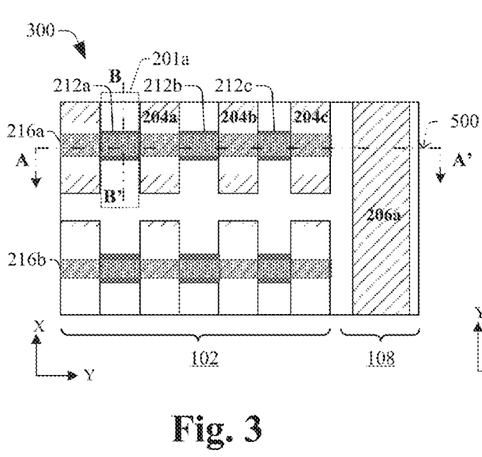
FIG. 3 illustrates a cross-sectional view of some embodiments of a memory cell region of an integrated circuit (IC).

FIG. 3 shows some embodiments of a top view 300 of a memory cell region 102 of the integrated circuit (IC). As shown in the top view 300, a first control gate 216a may extend over a first plurality of floating gates 212, which are aligned in a first direction (y-direction), and may be separated by a plurality of STI regions 204. A second control gate 216b may extend over a second plurality of floating gates 212, which are aligned in the first direction (y-direction), and may be separated by a plurality of STI regions 204. A dielectric body 206a disposed at a boundary region 108 may comprise discrete portions or continuously run in a second direction (x-direction), perpendicular to the first direction (y-direction), along STI regions 204 and spaces therebetween.

Figure 4:
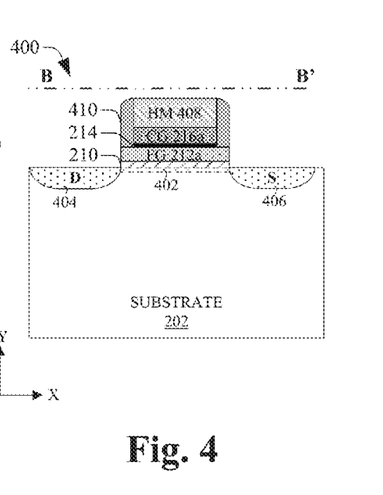
FIG. 4 illustrates a top view of some embodiments of a memory cell region of an integrated circuit (IC).

FIG. 4 shows some embodiments of a cross-sectional view 400 of a memory cell (e.g., memory cell 201a of FIG. 3) along a perpendicular line B-B' of FIG. 3. As shown in the cross-sectional view 400, the memory cell 201a comprises a drain region 404 and a source region 406 spaced apart by a channel region 402 in the x direction. The control gate 216 is capacitively coupled to the floating gate 212a, which is separated by a charge trapping dielectric 214. A gate dielectric 210 is disposed between the floating gate 212a and the channel region 402. In some embodiments, a hard mask layer 408 can be disposed over the control gate 216. A spacer 410 can be disposed along sidewalls of the first control gate 216.

Figure 5:
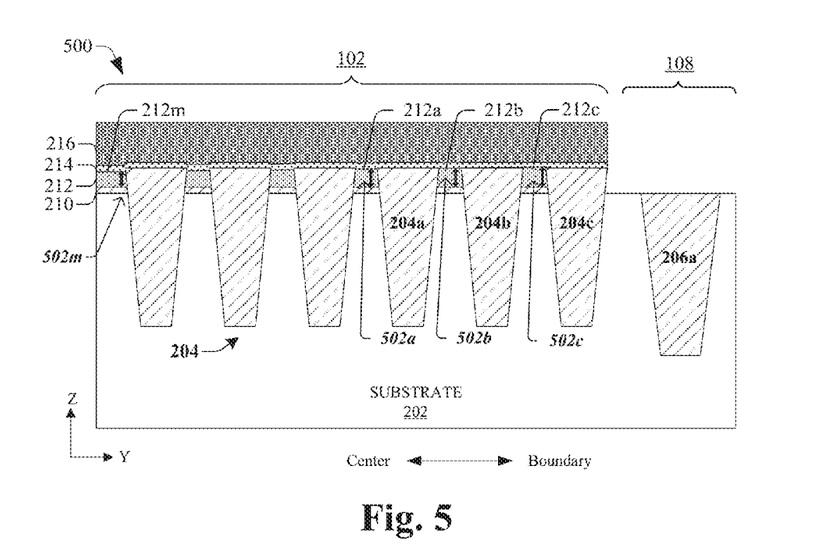
FIG. 5 illustrates a cross-sectional view of some other embodiments of a memory cell region of an integrated circuit (IC) along a line B-B'.

FIG. 5 shows some embodiments of a cross-sectional view 500 of a memory cell region 102 of the integrated circuit (IC) along line A-A of FIG. 3. The plurality of floating gates 212 (e.g. 212a, 212b, 212c, 212m . . . ) are respectively disposed between adjacent STIs 204, having various heights 502 (e.g. 502a, 502b, 502c, 502m . . . ). The height 502 decreases from boundary to center of the memory cell region 102. For example, a first flash memory cell having a first floating gate 212c is disposed closer to boundary of the memory cell region 102 than a second flash memory cell having a second floating gate 212m. The first floating gate 212c has a first height 502c greater than a second height 502m of the second floating gate 212m.

Figure 6:
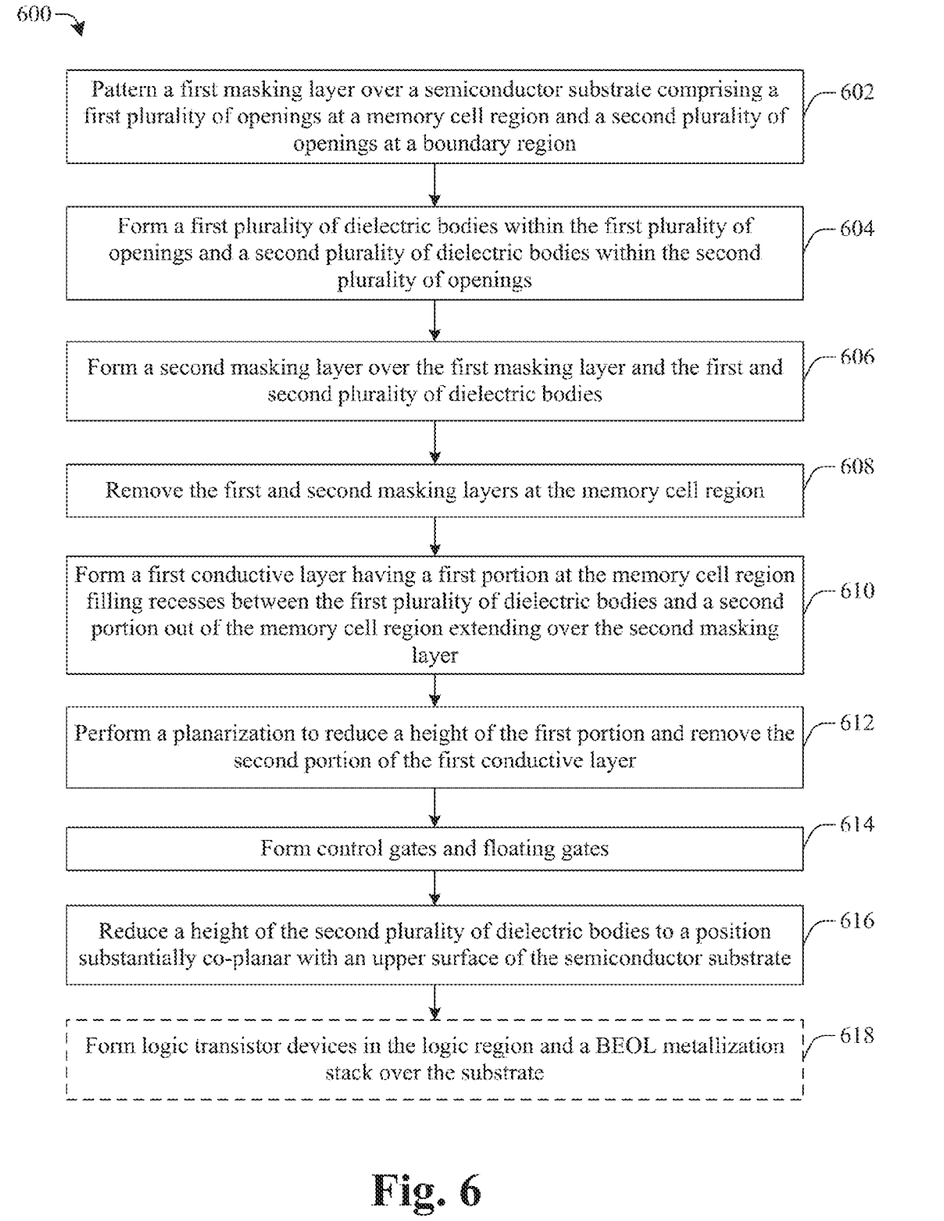
FIG. 6 illustrates a flow diagram of some embodiments of a method of forming an integrated circuit (IC) having a plurality of dielectric bodies disposed at a boundary region.

FIG. 6 shows a flow diagram of a method 600 of forming an embedded flash memory device in accordance with some embodiments. While the disclosed method 600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 602, a first masking layer is patterned over a semiconductor substrate. The first masking layer comprises a first plurality of openings at a memory cell region and a second plurality of openings at a boundary region.

At act 604, a first plurality of dielectric bodies are formed within the first plurality of openings and a second plurality of dielectric bodies are formed within the second plurality of openings.

At act 606, a second masking layer is patterned over the first masking layer and the first and second plurality of dielectric bodies and the memory cell region are exposed.

At act 608, the first and second masking layers at the memory cell region are removed.

At act 610, a first conductive layer is formed having a first portion at the memory cell region filling recesses between the first plurality of dielectric bodies and a second portion at the boundary region extending over the second masking layer.

At act 612, a planarization is performed to reduce a height of the first portion and remove the second portion of the first conductive layer.

At act 614, control gates and floating gates are formed.

At act 616, a height of the second plurality of dielectric bodies is reduced to a position substantially co-planar with an upper surface of the semiconductor substrate.

At 618, one or more logic transistor devices may be formed in the logic region and a back-end-of-the-line metallization stack may be formed over the substrate, in some embodiments.

FIGS. 7-17B illustrate some embodiments of cross-sectional views showing a method of an integrated circuit (IC) having a plurality of dielectric bodies disposed at a boundary region. Although FIGS. 7-17B are described in relation to method 600, it will be appreciated that the structures disclosed in FIGS. 7-17B are not limited to such a method, but instead may stand alone as structures independent of the method.

Figure 7:
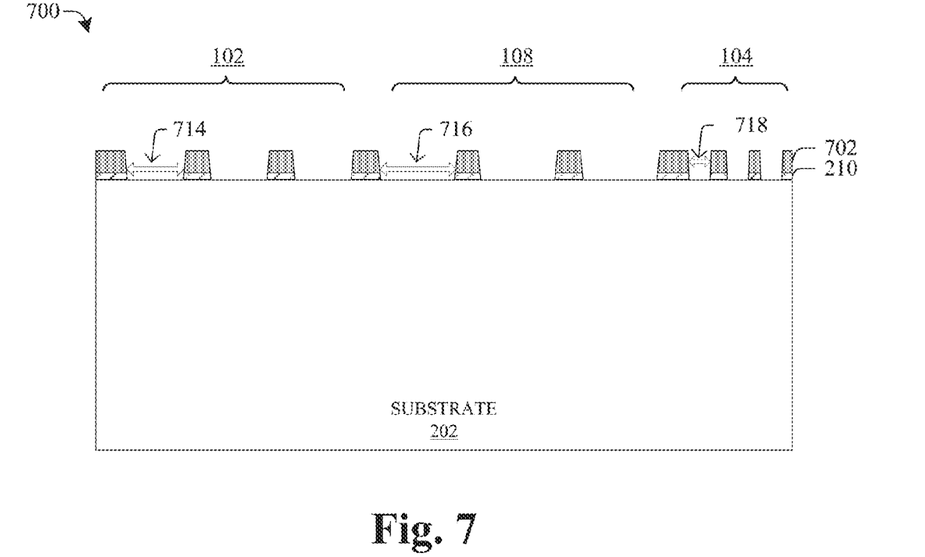

FIG. 7 illustrates some embodiments of a cross-sectional view 700 corresponding to act 602. As shown in cross-sectional view 700, a first dielectric layer 210 and a first masking layer 702 are formed and patterned over a semiconductor substrate 202, leaving a first plurality of openings 714 at a memory cell region 102 and a second plurality of openings 716 at a boundary region 108. In some embodiments, the first masking layer 702 and the first dielectric layer 210 can be formed to additionally expose other regions of the semiconductor substrate 202 that are to be employed as isolation regions. For example, the first dielectric layer 210 and the first masking layer 702 may be formed to have a third plurality of openings 718 corresponding to a logic region 104.

The semiconductor substrate 202 is typically planar with a uniform thickness. Further, the semiconductor substrate 202 can be n- or p-type, and can, for example, be a handle wafer, such as a Si wafer or a silicon-on-insulator (SOI) substrate. If present, an SOI substrate is often made up of an active layer of high quality silicon, which is arranged over a handle wafer and is separated from the handle wafer by a buried oxide layer. In some other embodiments, the semiconductor substrate can also be a sapphire substrate, a binary compound substrate (e.g. a III-V substrate), or other higher order compound substrate (e.g. AlGaAs), with or without additional insulating or conducting layers formed thereover, among others. The first dielectric layer 210 may be used as a gate dielectric, and can be an oxide, such as silicon dioxide. The first masking layer 702 can be nitride, such as silicon nitride, formed on the first dielectric layer 210, but other materials are amenable.

Figure 8:
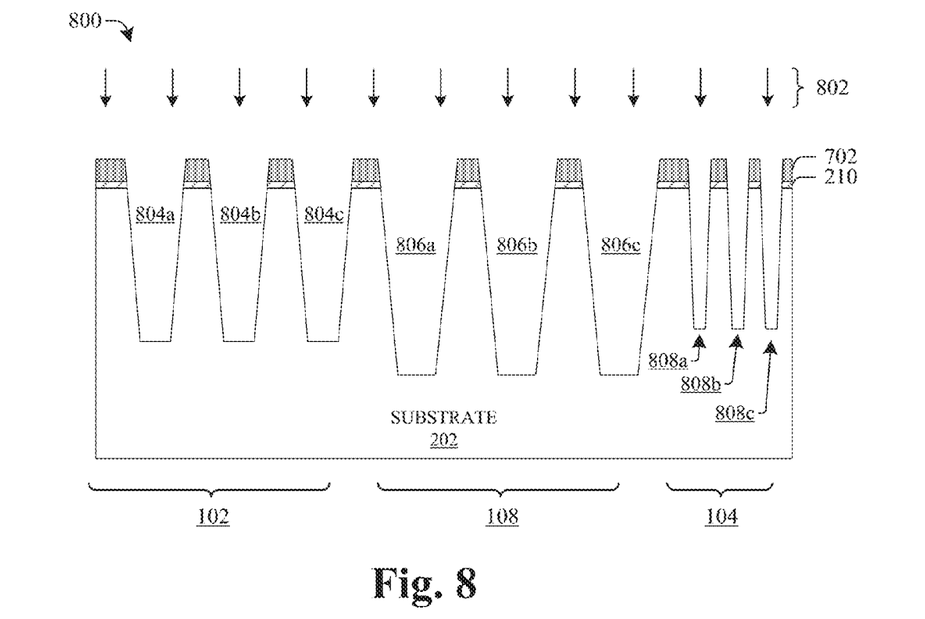
Figure 9:
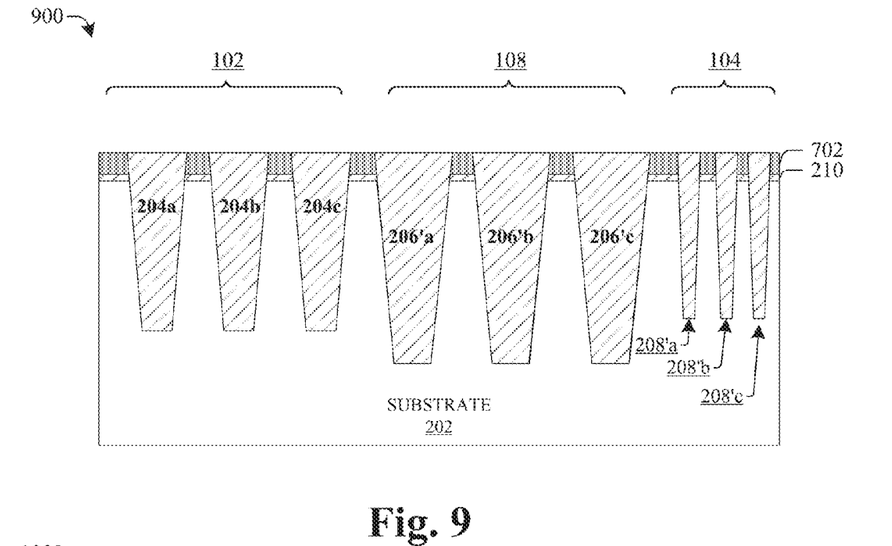

FIG. 8 and FIG. 9 illustrate some embodiments of cross-sectional views 800 and 900 corresponding to act 604. As shown in cross-sectional view 800, the semiconductor substrate 202 is selectively exposed to an etchant 802 in areas not covered by the first masking layer 702. The etchant 802 forms a first plurality of trenches 804, such as 804a, 804b, 804c . . . at the memory cell region 102 and a second plurality of trenches 806, such as 806a, 806b, 806c . . . at the boundary region 108 extending partially into the semiconductor substrate. In some embodiments, a third plurality of trenches 808 are also formed at the logic region 104. In some embodiments, the second plurality of trenches 806 has a depth or a width that is greater than the first or third plurality of trenches 804, 808. In this way, later formed dielectric bodies at the boundary region 108 can provide sufficient support for the following process.

In some embodiments, the etchant 802 may comprise a dry etchant. In some embodiments, the dry etchant may have an etching chemistry comprising a fluorine species (e.g., $CF_4$, $CHF_3$, $C_4F_8$, etc.). In some embodiments, the etching chemistry may further comprise oxygen or hydrogen, for example. In other embodiments, the etchant 802 may comprise a wet etchant comprising hydroflouric acid (HF). In some embodiments, the etchant 208 may form the pluralities of trenches, 804, 806, 808 by performing an anisotropic etch into the semiconductor substrate 202.

As shown in cross-sectional view 900, an insulating material is formed to fill the trenches to form a first plurality of dielectric bodies 204 at the memory cell region, as STIs, and a second plurality of dielectric bodies 206' (e.g. 206'a, 206'b, 206'c . . . ) at the boundary region as supports. The insulating material can be formed by using a deposition technique (e.g., CVD, PE-CVD, PVD, etc.) to fill the pluralities of trenches, 804, 806, 808 and to cover the first masking layer 702 first; and then by planarizing the substrate to expose the first masking layer 702. In some embodiments, the insulating material can be an oxide, such as silicon dioxide.

Figure 10:
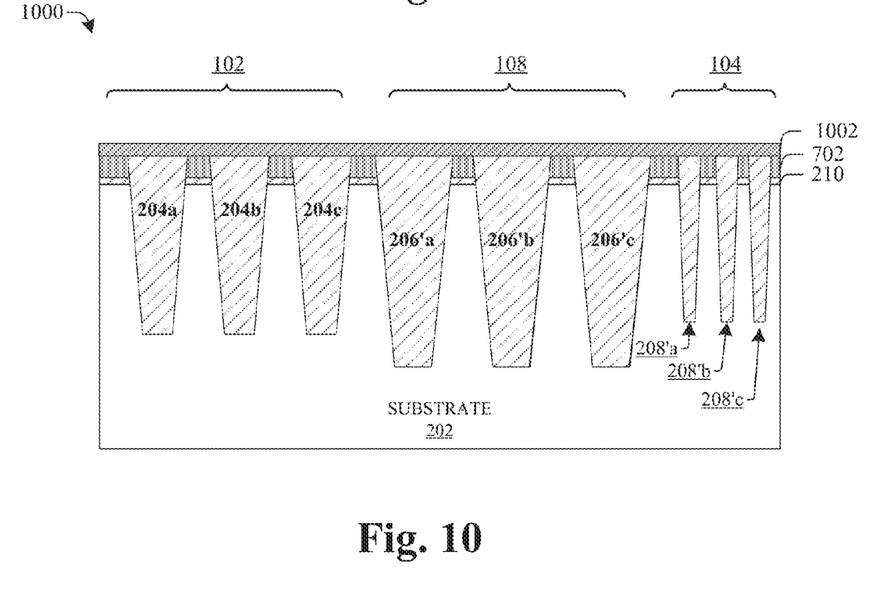

FIG. 10 illustrates some embodiments of a cross-sectional view 1000 corresponding to act 606. As shown in cross-sectional view 1000, a second masking layer 1002 is formed over the first masking layer 702 and the first and second plurality of dielectric bodies 204 and 206'. In some embodiments, the second masking layer 1002 can be an oxide, such as silicon dioxide.

Figure 11:
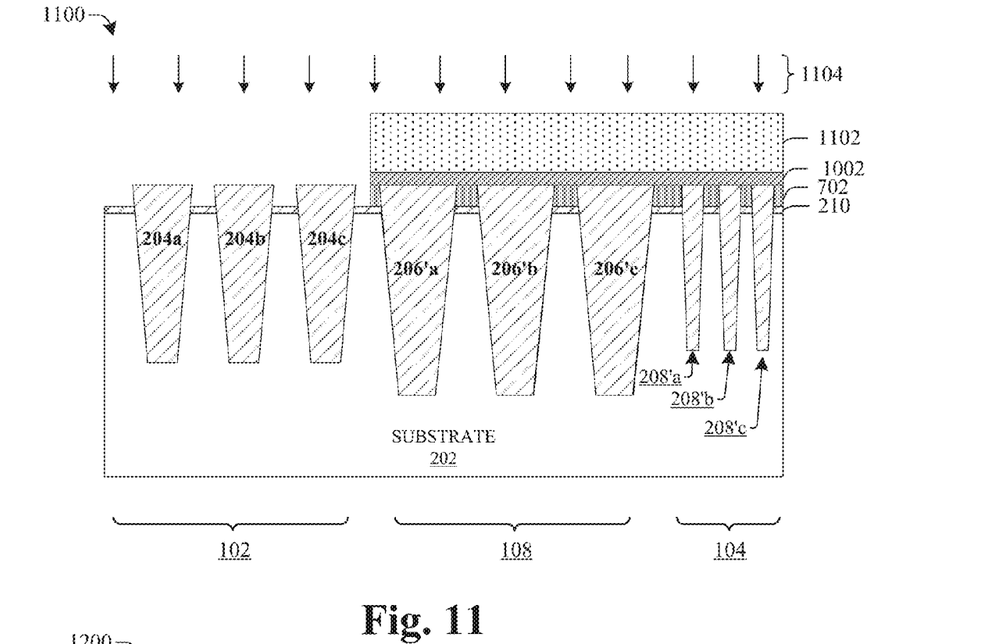

FIG. 11 illustrates some embodiments of a cross-sectional view 1100 corresponding to act 608. As shown in cross-sectional view 1100, the first and second masking layers 702 and 1002 are selectively exposed to an etchant 1104 in areas not covered by a masking layer 1102 (e.g., a photoresist layer). In various embodiments, the etchant 1104 may comprise a wet etchant (e.g. hydroflouric acid, phosphoric acid, etc.) or a dry etchant. The etchant 1104 is configured to remove the first and second masking layers 702 and 1002 at the memory cell region 102. Then the masking layer 1102 is removed.

Figure 12:
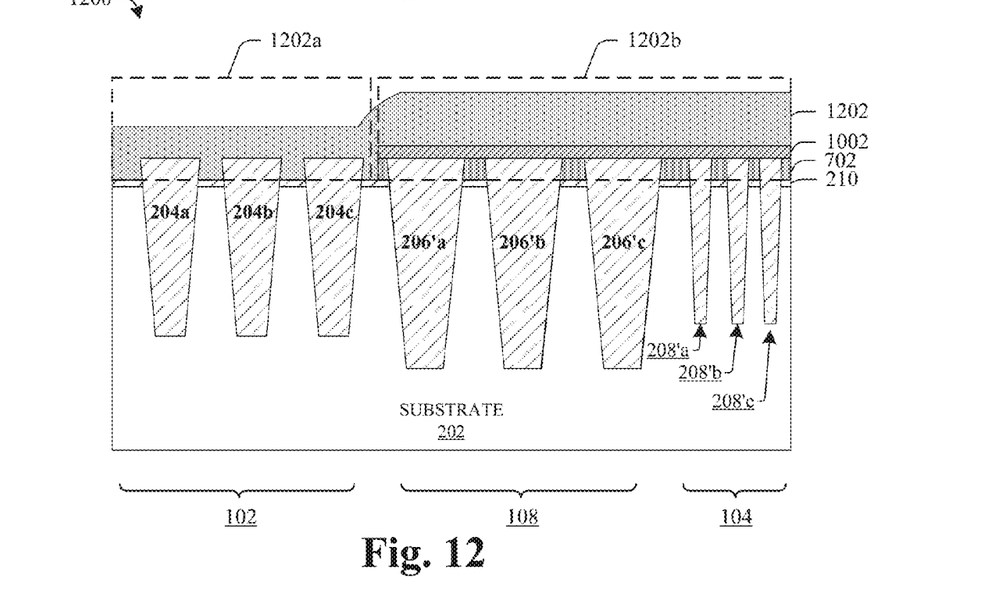

FIG. 12 illustrates some embodiments of a cross-sectional view 1200 corresponding to act 610. As shown in cross-sectional view 1200, a conductive layer 1202 is formed having a first portion 1202a at the memory cell region 102 and a second portion 1202b outside of the memory cell region 102. The first portion 1202a of the conductive layer 1202 fills recesses between the first plurality of dielectric bodies 204 and covers the first plurality of dielectric bodies 204. The second portion 1202b of the conductive layer 1202 extends over the second masking layer 1002. The first conductive layer 1202 can be formed of polysilicon or metal and may have a maximum thickness of from about 450 Å to about 550 Å.

Figure 13:
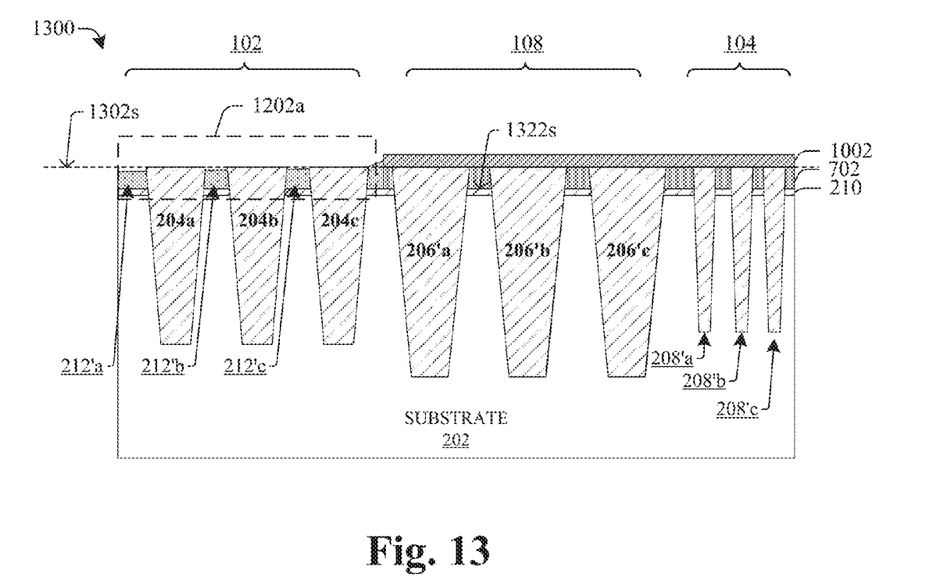

FIG. 13 illustrates some embodiments of a cross-sectional view 1300 corresponding to act 612. As shown in cross-sectional view 1300, a planarization is performed to reduce a height of the first portion 1202a of the first conductive layer 1202 and to remove the second portion 1202b of the first conductive layer 1202. Remaining portions of the first conductive layer include a plurality of floating gate precursors (e.g. 212'a, 212'b, 212'c . . . ) arranged between the first plurality of dielectric bodies 204 (e.g. 204a, 204b, 204c . . . ). Since the second masking layer 1002 is higher than an upper surface 1302s of the first plurality of dielectric bodies 204 and other factors, heights of floating gate precursors decrease from boundary to center of the memory cell region 102. For example, a first floating gate precursor 212'c, which is at a position closer to the boundary region 108 than a second floating gate precursor 212'a, has a height that is higher than a height of the second floating gate precursor 212'a. As an example, the height difference of the floating gate precursors 212' from the boundary to the center of the memory cell region 102 can be in a range of from about 50 Å to about 70 Å. In some embodiments, the planarization process may comprise a chemical mechanical polishing (CMP) process. During the CMP process, the boundary region 108 are supported by the second dielectric bodies 206' and protected by the second masking layer 1002. Thus an upper surface 1322s of the semiconductor substrate 202 are protected from damaging.

Figure 14:
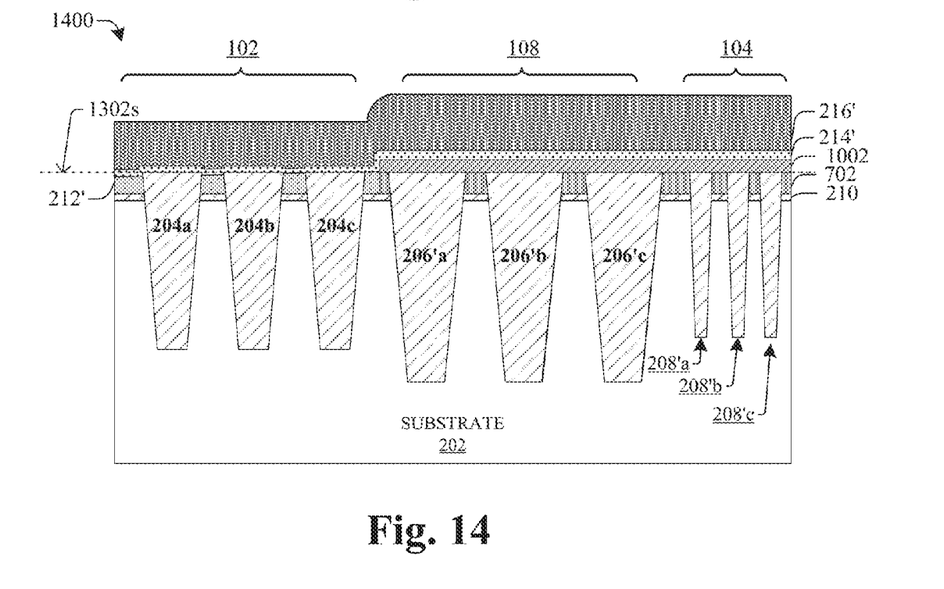
Figure 15:
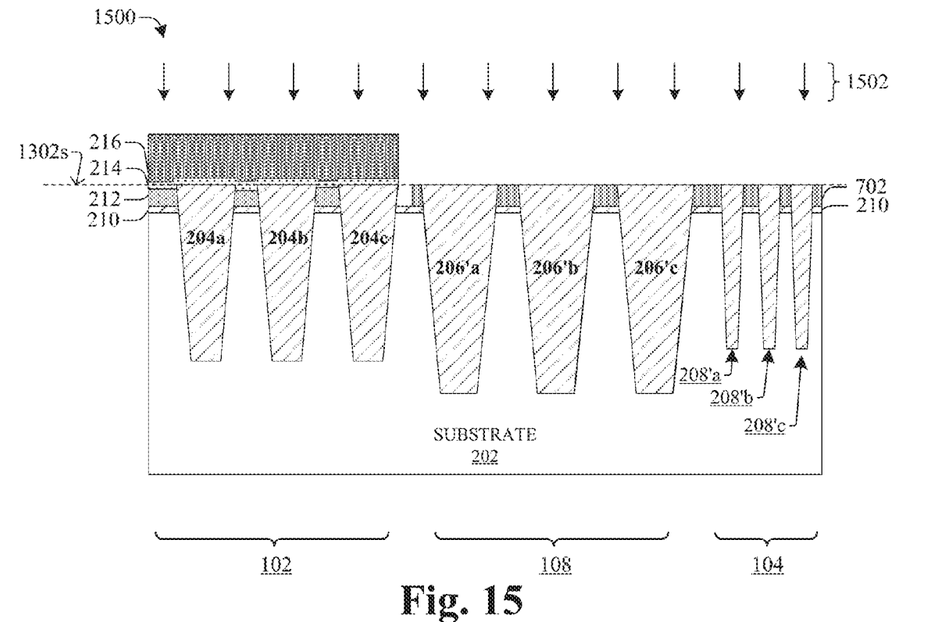

FIG. 14 and FIG. 15 illustrate some embodiments of cross-sectional views 1400 and 1500 corresponding to act 614. As shown in cross-sectional view 1400, a second dielectric layer 214', and a second conductive layer 216' are formed over the floating gate precursor 212' and the second masking layer 1002. The second dielectric layer 214' is typically an ONO dielectric and conforms to the floating gate precursor 212' and the second masking layer 1002. The second conductive layer 216' is typically polysilicon.

As shown in cross-sectional view 1500, the second conductive layer 216', the second dielectric layer 214' and the second masking layer 1002 are patterned and removed from out of the memory cell region 102, such as removed from the boundary region 108 and the logic region 104. The second conductive layer 216', the second dielectric layer 214', and the floating gate precursors 212' formed in the memory cell region 102 are also patterned to respectively form control gates 216, charge trapping layers 214 and floating gates 212 for memory cells. In various embodiments, patterning may be performed using one or more etchants 1502 such as a dry etchant (e.g., an RIE etch, a plasma etch, etc.) or a wet etchant (e.g., hydroflouric acid, phosphoric acid, etc.).

Figure 16:
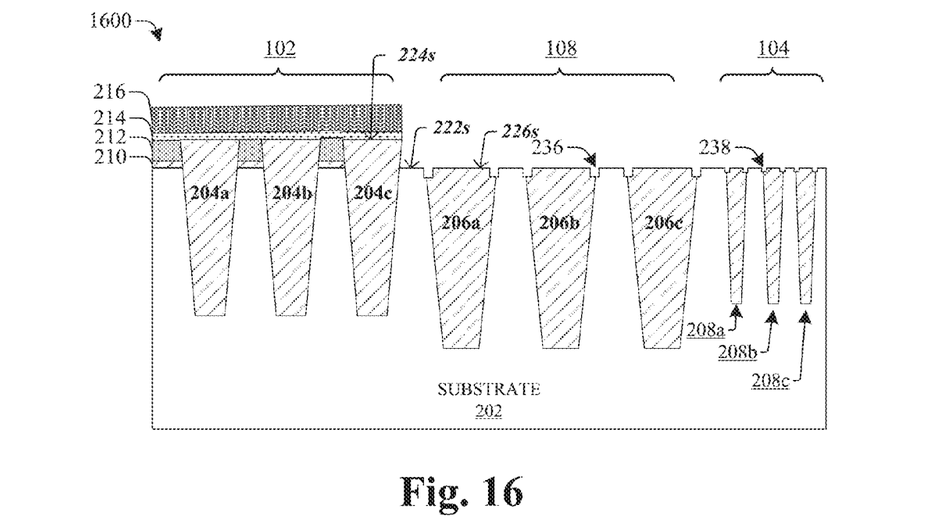

FIG. 16 illustrates some embodiments of a cross-sectional view 1600 corresponding to act 616. As shown in cross-sectional view 1600, a height of the second plurality of dielectric bodies 206 is reduced to a position 226s substantially co-planar with an upper surface 222s of the semiconductor substrate 202. In some embodiments, a wet etchant is used to remove the extra portion. In some embodiments, recess rings 236, 238 are respectively formed at peripherals of the pluralities of dielectric bodies 206, 208. The recess rings 236, 238 cause the peripherals of the plurality of dielectric bodies 206, 208 to be recessed below centers of the pluralities of dielectric bodies 206, 208.

Figure 17A:
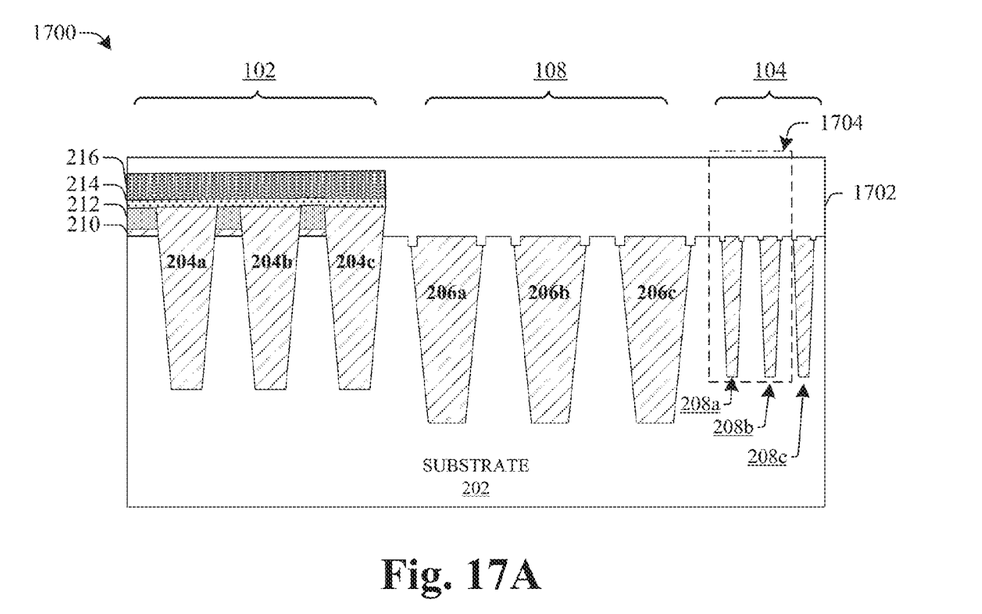
Figure 17B:
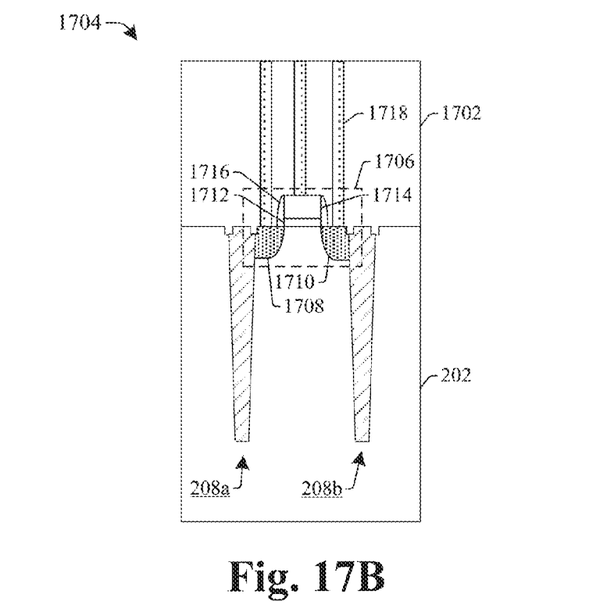

FIGS. 17A-17B illustrate some embodiments of cross-sectional views, 1700 and 1704, corresponding to act 618.

As shown in cross-sectional view 1700, an inter-metal dielectric (IMD) layer 1702 is disposed over the substrate 202. The IMD layer 1702 may be deposited by way of a vapor deposition process and may comprise a low-k dielectric layer or an ultra low-k (ULK) dielectric layer, for example. In area 1704, shown in FIG. 17B, a logic transistor device 1706 is formed in the logic region 104 between adjacent STI regions, 208a and 208b. In some embodiments, the logic transistor device 1702 may comprise a source region 1708 and a drain region 1710 disposed within the substrate 202. A gate region, comprising a gate dielectric layer 1712 and an overlying gate electrode 1714, is laterally disposed onto the substrate 202 at a position laterally between the source and drain regions, 1708 and 1710. In some embodiments, one or more sidewall spacers 1716 may be formed on opposing sides of the gate dielectric 1712 and the gate electrode 1714. One or more metal contacts 1718 may be disposed within the IMD layer 1702 to electrically couple the logic transistor device 1706 to metal interconnect layers within a BEOL metallization stack.

Although various embodiments have been illustrated with regards to 1T floating gate flash memory cells, it will be appreciated that the present disclosure is also applicable to various types of non-volatile memory (NVM) devices. For example, flash memory cell devices include silicon-oxide-nitride-oxide-silicon (SONOS) split gate flash memory cell devices, metal-oxide-nitride-oxide-silicon (MONOS) split gate flash memory cell devices, and third generation SUPERFLASH (ESF3) memory cell devices. Another type of flash memory that is contemplated as falling within the scope of this disclosure is stacked gate flash memory cell. Concepts of the present disclosure are applicable to a wide range of flash memory and are not limited to the given examples.

Although the logic transistor device 1706 is illustrated as being formed after devices within the memory cell region 102, it will be appreciated that one or more layers of the logic transistor device 1706 may be formed concurrent with formation of the devices within the memory cell region 102. Furthermore, the type, size, shape, and/or orientation of the logic transistor device 1706 may be different than that shown in FIG. 17. For example, logic transistor device 1706 is illustrated as having a channel region (extending between source and drain regions, 1708 and 1710) oriented perpendicular to the channel of devices within the memory cell region 102, however it will be appreciated that the channel region of logic transistor device 1706 may be oriented parallel to the channel region of devices within the memory cell region 102.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

Accordingly, the present disclosure relates to a structure and method for forming an integrated circuit that has a plurality of dielectric bodies disposed at a boundary region of a memory cell region. The formation of the plurality of the dielectric bodies at the boundary region provides a sufficient support when planarizing a conductive layer to form memory gates of the memory device and further prevents damage of the semiconductor substrate at the boundary region.

In some embodiments, the present disclosure relates to a method of forming an integrated circuit (IC). The method comprises patterning a first masking layer over a semiconductor substrate comprising a first plurality of openings at a memory cell region and a second plurality of openings at a boundary region. The method further comprises forming a first plurality of dielectric bodies within the first plurality of openings and a second plurality of dielectric bodies within the second plurality of openings, wherein the first and second plurality of dielectric bodies extend into the semiconductor substrate. The method further comprises forming a second masking layer over the first masking layer and the first and second plurality of dielectric bodies. The method further comprises removing the first and second masking layers at the memory cell region. The method further comprises removing the first and second masking layers at the memory cell region. The method further comprises forming a first conductive layer having a first portion at the memory cell region filling recesses between the first plurality of dielectric bodies and a second portion out of the memory cell region extending over the second masking layer. The method further comprises performing a planarization to reduce a height of the first portion and remove the second portion of the first conductive layer.

In another embodiment, the present disclosure relates to a method of forming an integrated circuit (IC) for an embedded flash memory device. The method comprises providing a semiconductor substrate having a first plurality of dielectric bodies disposed at a memory cell region and a second plurality of dielectric bodies disposed at a boundary region surrounding the memory cell region, wherein a first masking layer is disposed over the semiconductor substrate within recesses between adjacent first and second pluralities of dielectric bodies. The first masking layer has an upper surface that is substantially co-planar with an upper surface of the dielectric bodies. The method further comprises forming a second masking layer over the first masking layer and the dielectric bodies; patterning the first and second masking layers to remove the first and second masking layers from the memory cell region and keeping the first and second masking layers in the boundary region; forming a first conductive layer having a first portion filling exposed recesses between the first plurality of dielectric bodies and a second portion extends over the first and second masking layers; performing a planarization to reduce a height of the first portion and remove the second portion of the first conductive layer; forming a second dielectric layer and a second conductive layer over the first conductive layer and the first and second masking layers; and performing an etch to remove a portion of the second conductive layer, the charge trapping layer and the first and second masking layers out of the memory cell region, and to reduce a height of the second plurality of dielectric bodies to an upper surface of the semiconductor substrate.

In yet another embodiment, the present disclosure relates to an integrated circuit (IC) for an embedded flash memory device, the IC comprises a memory cell region and a boundary region. The memory cell region is disposed over a semiconductor substrate and comprises a plurality of flash memory cells separated by a plurality of shallow trench isolations (STIs) having an upper surface higher than an upper surface of the semiconductor substrate. The boundary region surrounds the memory cell region and comprises a plurality of dielectric bodies disposed within the semiconductor substrate. The plurality of dielectric bodies have an upper surface co-planar with the planar upper surface of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC), the method comprising:
   patterning a first masking layer over a semiconductor substrate comprising a first plurality of openings at a memory cell region and a second plurality of openings at a boundary region;
   forming a first plurality of dielectric bodies within the first plurality of openings and a second plurality of dielectric bodies within the second plurality of openings, wherein the first and second plurality of dielectric bodies extend into the semiconductor substrate;
   forming a second masking layer over the first masking layer and the first and second plurality of dielectric bodies;
   removing the first and second masking layers at the memory cell region;
   forming a first conductive layer having a first portion at the memory cell region filling recesses between the first plurality of dielectric bodies and a second portion out of the memory cell region extending over the second masking layer; and
   performing a planarization to reduce a height of the first portion and remove the second portion of the first conductive layer.

2. The method of claim 1, further comprising forming control gates and floating gates, comprising:
   forming a charge trapping layer and a second conductive layer over the first conductive layer and the second masking layer; and
   patterning the second conductive layer, the charge trapping layer and the first and second masking layers to form the control gates and the floating gates.

3. The method of claim 1, further comprising:
   reducing a height of the second plurality of dielectric bodies to a position substantially co-planar with an upper surface of the semiconductor substrate.

4. The method of claim 1, further comprising:
   forming a plurality of flash memory cells at the memory cell region, and a logic circuitry spaced apart from the memory cell region by the boundary region, wherein a third plurality of dielectric bodies is formed at the logic circuitry having an upper surface substantially co-planar with that of the second plurality of dielectric bodies and the semiconductor substrate.

5. The method of claim 4, further comprising:
   forming recess rings at peripherals of the second and third pluralities of dielectric bodies, wherein the recess rings cause the peripherals of the second and third pluralities of dielectric bodies to be recessed below centers of the second and third pluralities of dielectric bodies.

6. The method of claim 1,
   wherein the first plurality of dielectric bodies extend to a first depth within the semiconductor substrate and the second plurality of dielectric bodies extend to a second depth within the semiconductor substrate,
wherein the second depth is greater than the first depth.

7. The method of claim 1, wherein the second plurality of openings has a width that is greater than that of the first plurality of openings.

8. The method of claim 1,
wherein the first conductive layer is planarized by a chemical mechanical polishing (CMP) process; and
wherein the planarization causes a height of the first conductive layer to increase from a center to a boundary of the memory cell region.

9. The method of claim 1, wherein the first plurality of dielectric bodies extend out from the substrate to upper surfaces that are higher than upper surfaces of the second plurality of dielectric bodies.

10. A method of forming an integrated circuit (IC) for an embedded flash memory device, comprising:
providing a semiconductor substrate having a first plurality of dielectric bodies disposed at a memory cell region and a second plurality of dielectric bodies disposed at a boundary region surrounding the memory cell region, wherein a first masking layer is disposed over the semiconductor substrate within recesses between adjacent first and second pluralities of dielectric bodies, wherein the first masking layer has an upper surface that is substantially co-planar with an upper surface of the dielectric bodies;
forming a second masking layer over the first masking layer and the dielectric bodies;
patterning the first and second masking layers to remove the first and second masking layers from the memory cell region and keeping the first and second masking layers in the boundary region;
forming a first conductive layer having a first portion filling exposed recesses between the first plurality of dielectric bodies and a second portion extends over the first and second masking layers;
performing a planarization to reduce a height of the first portion and remove the second portion of the first conductive layer;
forming a charge trapping layer and a second conductive layer over the first conductive layer and the first and second masking layers; and
performing an etch to remove a portion of the second conductive layer, the charge trapping layer and the first and second masking layers out of the memory cell region, and to reduce a height of the second plurality of dielectric bodies to an upper surface of the semiconductor substrate.

11. The method of claim 10, wherein the first portion of the first conductive layer after the planarization has a decreasing height from peripheral to center of the memory cell region.

12. The method of claim 10, further comprising:
forming a plurality of flash memory cells at the memory cell region, wherein the first conductive layer is used as floating gate precursors and the second conductive layer is used as control gate precursors.

13. The method of claim 10, wherein providing a semiconductor substrate having a first plurality of dielectric bodies disposed at a memory cell region and a second plurality of dielectric bodies disposed at a boundary region surrounding the memory cell region comprises:
patterning the first masking layer over the semiconductor substrate, wherein a first plurality of openings is formed over a memory cell region and a second plurality of openings is formed over a boundary region surrounding the memory cell region;
performing an anisotropic etch into the semiconductor substrate, to form a first plurality of trenches under the first plurality of openings and a second plurality of trenches under the second plurality of openings;
filling a dielectric material into the first and second pluralities of trenches, extending over the first masking layer; and
performing a planarization to reduce a height of the dielectric material to an upper surface of the first masking layer.

14. The method of claim 10, wherein patterning the first and second masking layers to remove a first portion of the first and second masking layers at the memory cell region and keeping a remaining portion of the first and second masking layers including a second portion at the boundary region comprises:
forming a photoresist layer to cover a portion of the second masking layer out of the memory cell region;
performing a wet etching to remove the uncovered first portion of the first and second masking layers; and
removing the photoresist layer.

15. The method of claim 10, wherein performing an etch to remove a portion of the second conductive layer, the charge trapping layer and the first and second masking layers out of the memory cell region, and to reduce a height of the second plurality of dielectric bodies to an upper surface of the semiconductor substrate comprises:
performing a dry etching to remove a portion of the second conductive layer, the charge trapping layer and the second masking layer out of the memory cell region; and
performing a wet etching to remove the first masking layer and a uncovered gate oxide layer and reduce a height of the second plurality of dielectric bodies to an upper surface of the semiconductor substrate comprises.

16. An integrated circuit (IC), comprising:
a memory cell region disposed over a semiconductor substrate and comprising a plurality of flash memory cells separated by a plurality of shallow trench isolations (STIs) having an upper surface higher than planar upper surface of the semiconductor substrate; and
a boundary region surrounding the memory cell region comprising a plurality of dielectric bodies disposed within the semiconductor substrate, wherein the plurality of dielectric bodies have an upper surface co-planar with the planar upper surface of the semiconductor substrate.

17. The IC of claim 16, wherein the plurality of flash memory cells respectively comprises:
a floating gate disposed between adjacent STIs; and
a control gate separated from the floating gate by a charge trapping dielectric.

18. The IC of claim 17, wherein a first floating gate of a first flash memory cell that is closer to boundary of the memory cell region has a first height that is greater than a second height of a second floating gate of a second flash memory cell that is closer to center of the memory cell region.

19. The IC of claim 18, wherein a difference between the first height and the second height is in a range of from about 50 Å to about 70 Å.

20. The IC of claim 16, further comprising:
a logic region that is spaced apart from the memory cell region by the boundary region, wherein the planar upper surface of the semiconductor substrate is coplanar with an upper surface of shallow trench isolations disposed within the logic region.

* * * * *